United States Patent
Shin

(12) 
(10) Patent No.: US 6,486,048 B1
(45) Date of Patent: Nov. 26, 2002

(54) METHOD FOR FABRICATING A SEMICONDUCTOR DEVICE USING CONDUCTIVE OXIDE AND METAL LAYER TO SILICIDE SOURCE + DRAIN

(75) Inventor: Dong Suk Shin, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/034,791

(22) Filed: Dec. 27, 2001

(30) Foreign Application Priority Data

Oct. 6, 2001 (KR) .............................. 01-61646

(51) Int. Cl.[7] ...................... H01L 21/336; H01L 21/22; H01L 21/38; H01L 21/44
(52) U.S. Cl. ...................... 438/555; 438/664; 438/682; 438/299
(58) Field of Search ................... 438/555, 664, 438/682, 299

(56) References Cited

U.S. PATENT DOCUMENTS

| | | | | |
|---|---|---|---|---|
| 5,047,367 A | * | 9/1991 | Wei et al. | |
| 5,567,652 A | * | 10/1996 | Nishio | |
| 5,744,832 A | * | 4/1998 | Wolters et al. | |
| 6,100,181 A | * | 8/2000 | You et al. | 438/633 |
| 6,214,710 B1 | * | 4/2001 | Park et al. | 438/586 |

FOREIGN PATENT DOCUMENTS

| | | |
|---|---|---|
| JP | 09251967 | 9/1997 |
| JP | 10008245 | 1/1998 |
| JP | 10012878 | 1/1998 |
| JP | 10321850 | 12/1998 |
| JP | 11044223 | 2/1999 |

\* cited by examiner

*Primary Examiner*—John F. Niebling
*Assistant Examiner*—Ron Pompey
(74) *Attorney, Agent, or Firm*—Ladas & Parry

(57) ABSTRACT

A method for fabricating semiconductor device capable of forming silicide suitable for highly integrated semiconductor device comprising the steps of: forming a conductive oxide layer and metal layer on a substrate having a gate and source/drain regions; performing a first thermal treatment on the resulting structure; selectively removing the metal layer to retain the metal layer over only the part corresponding to the source/drain regions; forming an intermediate phase by etching the conductive oxide layer with the remaining metal layer employed as a mask; and forming a silicide layer by performing a second thermal treatment on the substrate including the intermediate phase.

12 Claims, 3 Drawing Sheets

METHOD FOR FABRICATING A SEMICONDUCTOR DEVICE USING CONDUCTIVE OXIDE AND METAL LAYER TO SILICIDE SOURCE + DRAIN

BACKGROUND OF THE INVENTION

1. Field of the Invention

The present invention relates generally to a method for fabricating a semiconductor device, and more particularly, to a method for fabricating a semiconductor device capable of forming silicide suitable for highly integrated semiconductor devices.

2. Description of the Related Art

As is generally known, in order to reduce contact resistance and sheet resistance of source/drain regions in CMOS, a method has been proposed that a silicide layer is formed by using titanium Ti, cobalt Co or nickel Ni having low resistivity and contact resistance in the source/drain regions.

The formation of silicide will be described below, using as an example formation of cobalt silicide. First, a cobalt layer Co is deposited on a substrate including source/drain regions. The cobalt layer has low resistivity, below 18 $\mu\Omega$/cm, and improved thermal stability.

Subsequent to deposition, the cobalt layer Co is subjected to a first Rapid Thermal Process (RTP) at a temperature below 650° C., thereby forming an intermediate phase cobalt silicide, CoSi.

Subsequently, the cobalt layer Co is selectively removed, in accordance with a wet etch process, so as to retain CoSi only on the source/drain. A second RTP is performed on the remaining cobalt layer Co at a temperature of 650~750° C., thereby obtaining a desirable cobalt silicide layer, $CoSi_2$.

However, the cobalt silicide layer $CoSi_2$ has a thickness that is greater than desirable by about 3~4 times, compared with that of the early stage and the surface is very rugged since the Cobalt is diffused, thereby rapidly generating a reaction with the silicon Si. Therefore, the cobalt silicide layer $CoSi_2$ has a higher resistance than either titanium silicide or nickel silicide.

As semiconductor devices have become highly integrated, it became necessary to develop a shallow junction. However, it is difficult to apply the cobalt silicide and nickel silicide $NiSi_2$ onto the semiconductor device having the shallow junction since the semiconductors have a heavy thickness and a rugged surface.

Using titanium silicide $TiSi_2$ provides better conditions than when using cobalt silicide or nickel silicide. However, it is also difficult to apply titanium silicide to a semiconductor device, since it presents a rough surface. In particular, when it is applied to a device having a line width below 0.25 $\square$, contact resistance is remarkably increased and when it is applied to a highly integrated memory device over 1 Gigabit DRAM, a problem of current leakage develops.

SUMMARY OF THE INVENTION

Therefore, the present invention has been made to solve the above-mentioned problems and the object of the present invention is to provide a method of fabricating a semiconductor device capable of forming a silicide having a thin thickness and smooth surface by decreasing the speed of metal diffusion.

In order to accomplish the above object, the present invention comprises the steps of: sequentially forming a conductive oxide layer and a metal layer on a substrate having a gate and source/drain regions; performing a first thermal treatment on the resulting structure; selectively removing the metal layer to retain the metal layer over only the part corresponding to the source/drain regions; forming an intermediate phase by etching the conductive oxide layer with the remaining metal layer employed as a mask; and forming a silicide layer by performing a second thermal treatment on the substrate including the intermediate phase.

DETAILED DESCRIPTION OF THE INVENTION

The above objects, and other features and advantages of the present invention will become more apparent after reading the following detailed description when taken in conjunction with the attached drawings.

FIGS. 1A to 1E are cross sectional views for showing the steps of a method for fabricating a semiconductor device according to the present invention.

Figure 1A:
FIGS. 1A to 1E are cross sectional views showing a method for fabricating a semiconductor device according to the present invention.

Referring to FIG. 1A, a trench 102 is formed in accordance with a photolithography process to expose isolation regions on a semiconductor substrate 100 having defined isolation regions (not shown).

Then, a first insulating layer is deposited on the substrate, thereby filling up the trench 102. The first insulating layer is etched in accordance with a Chemical Mechanical Polishing (CMP) process or an etch back process, thereby forming an isolation layer 104 filling up the trench 102.

Figure 1B:
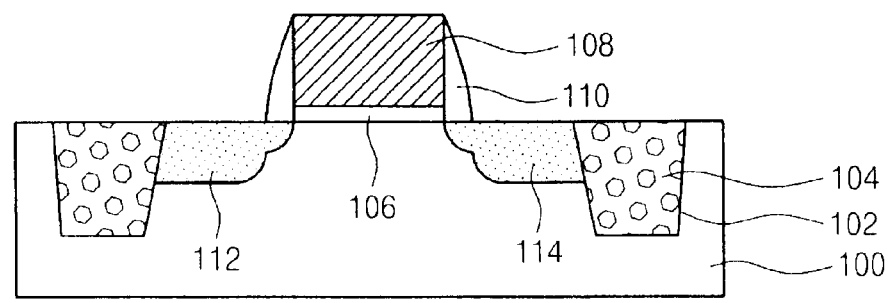

Referring to FIG. 1B, a second insulating layer and a first metal layer are sequentially deposited on the substrate 100 having the isolation layer 104. Then, the second insulating layer and the first metal layer are etched in accordance with a photolithography process, thereby forming a gate insulating layer 106 and a gate 108.

A third insulating layer is deposited on the substrate including over the gate 108 and then, the third insulating layer is subjected to an etch back process to form an insulating spacer 110 on the sidewall of the gate 108.

Then, source/drain regions 112, 114 are formed by implanting impurities on the lower substrate of the gate 108 including the insulating spacer 110. Subsequently, the insulting spacer is removed and dry cleaning process is performed by using $NF_3$ gas on the substrate exposing the source/drain regions 112,114. A wet cleaning process is continuously performed by using HF solution or Buffer Oxide Etchant (BOE) solution.

Figure 1C:
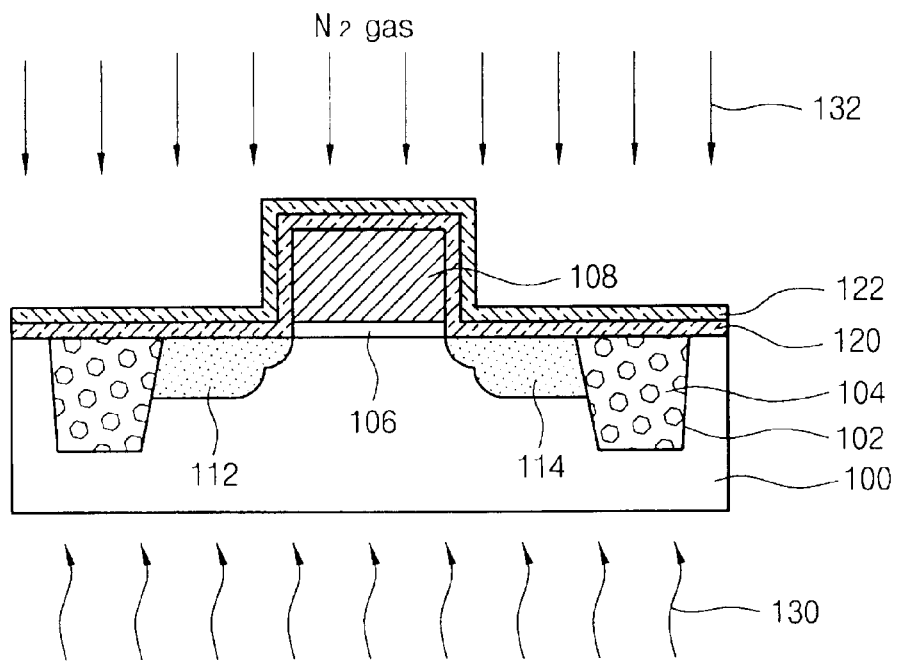

Referring to FIG. 1C, a conductive oxide layer 120 and a second metal layer 122 are sequentially deposited on the resulting structure. The conductive oxide layer 120 is formed by depositing Ru, Ir, Sr—Ru or Sr—Co metal to a thickness of from 10 to 500 Å in accordance with a Chemical Vapor Deposition process or a Physical Vapor Deposition process.

The second metal layer 122 is formed by depositing Co, Ti, W, Ta, Pt, Pd or Mo metal to a thickness of from 100 to 1000 Å in accordance with a Chemical Vapor Deposition process or a Physical Vapor Deposition process.

Then, a first thermal treatment 130 is performed on the resulting structure, including the conductive oxide layer 120 and the second metal layer 122, at a temperature of between 500 and 800° C., desirably between 500 and 650° C.

When the first thermal treatment 130 is performed, $N_2$ gas 132 is supplied for less than 30 minutes, and preferably for only one (1) minute. It is possible to employ $H_2$ gas or Ar gas instead of the $N_2$ gas.

Figure 1D:
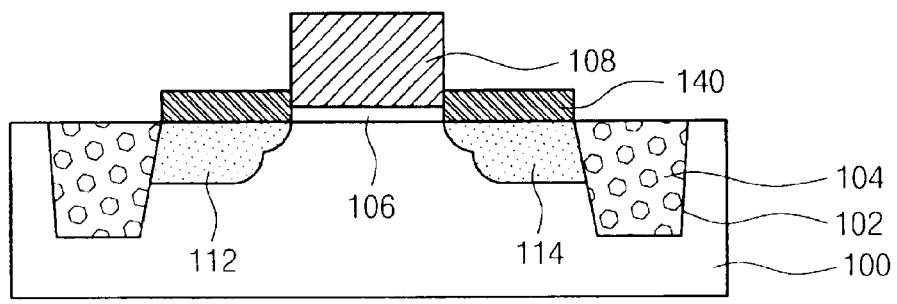

Referring to FIG. 1D, the second metal layer is selectively removed to retain the metal layer only on the source/drain regions 112,114. Then, the conductive oxide layer 120 is etched by employing the remaining second metal layer as a mask, thereby forming an intermediate phase 140 over the source/drain regions 112,114. Here, the conductive oxide layer 120 is etched in accordance with a wet etch process using either HF solution or BOE solution.

The intermediate phase 140 is obtained by reaction of the metal and silicon in the second metal layer. The reaction results in a phase that is a CoSi, TiSi, WSi, TaSi, PtSi, Pd, Si or MoSi phase, according to the element of the second metal layer, and is formed on both sides of the gate 108, that is, over the parts corresponding to the source/drain regions 112,114.

The conductive oxide layer 120 is employed as a buffer between the substrate 100 and the metal layer for silicide formation, thereby decreasing the speed of metal diffusion of the second metal layer during the first thermal treatment.

Figure 1E:
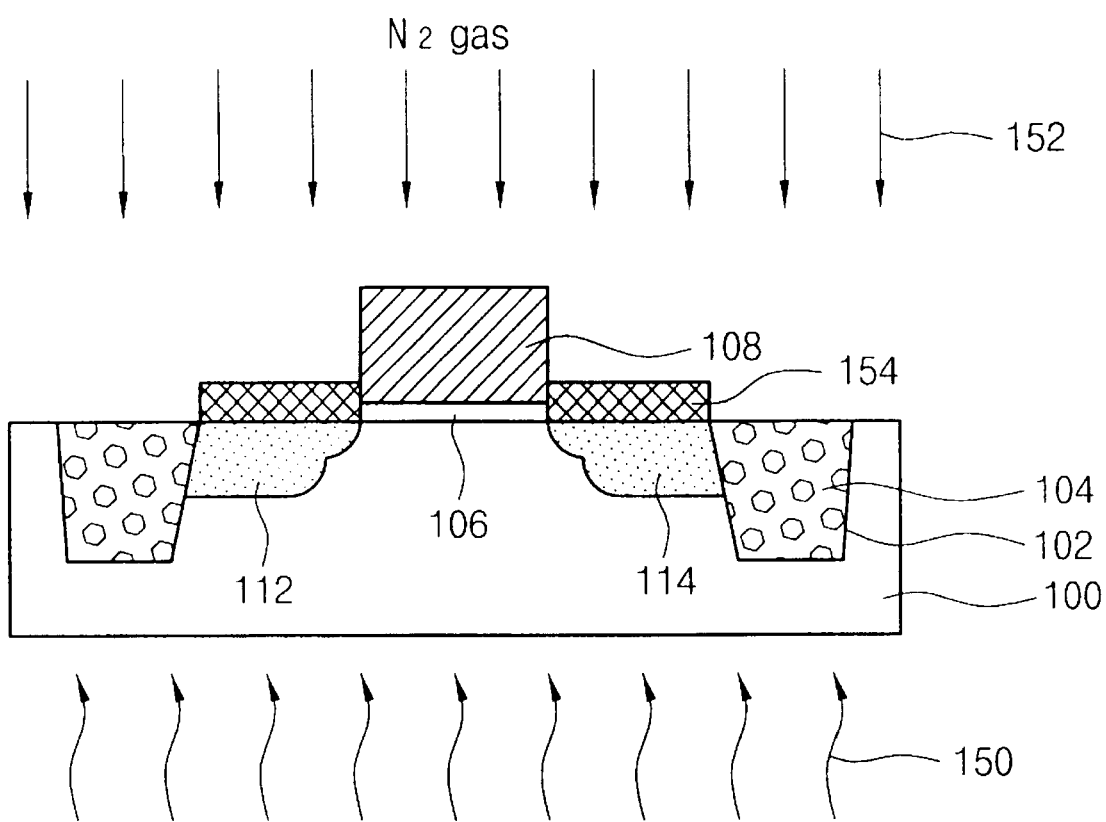

Referring to FIG. 1E, a second thermal treatment 150 is performed on the substrate having the intermediate phase 140. The second thermal treatment 150 is performed at a temperature of between 500 and 900° C., desirably between 650 and 850° C., wherein $N_2$ gas 152 is supplied for less than ten (10) minutes, and preferably about one (1) minute.

It is also possible to employ $H_2$ gas or Ar gas, instead of the $N_2$ gas, during the second thermal treatment 150.

As a result of the second thermal treatment 150, a silicide 154 is formed over that part corresponding to the source/drain 112,114 of the substrate 100.

According to the present invention, the conductive oxide layer is interposed as a buffer layer between the substrate and the metal layer for silicide formation and then, the first and the second rapid thermal processes are performed, thereby decreasing the speed of metal diffusion of the second metal layer.

Therefore, it is possible to obtain a silicide having a thin thickness parameter and a smooth surface due to the decreased diffusion speed of the second metal layer.

As described above, according to the present invention, the speed of metal diffusion is decreased by interposing the conductive oxide layer 120 as a buffer layer between the substrate 100 and the metal layer 122 for silicide formation. Therefore, it is possible to prevent increase of contact resistance due to decrease of circuit line width.

And, according to the present invention, when the silicide process is applied to a highly integrated semiconductor device, it is possible to prevent increase of leakage current, thereby realizing highly integrated memory devices over 1 Gigabit DRAM.

Although the preferred embodiments of the invention have been disclosed for illustrative purposes, those skilled in the art will appreciate that various modifications, alterations, additions and substitutions are possible, without departing from the scope and spirit of the invention as set forth in the accompanying claims.

What is claimed is:

1. A method for fabricating semiconductor device comprising the steps of:
    forming a conductive oxide layer and metal layer on a substrate having a gate and source/drain regions;
    performing a first thermal treatment on the resulting structure;
    selectively removing the metal layer to retain the metal layer over only the part corresponding to the source/drain regions;
    forming an intermediate phase by etching the conductive oxide layer with the remaining metal layer employed as a mask; and
    forming a silicide layer by performing a second thermal treatment on the substrate including the intermediate phase.

2. The method for fabricating semiconductor device according to claim 1, wherein the conductive oxide layer comprises a metal selected from the group consisting of Ru, Ir, Sr—Ru and Sr—Co.

3. The method for fabricating semiconductor device according to claim 1, wherein the conductive oxide layer has a thickness of between 10 and 500 Å.

4. The method for fabricating semiconductor device according to claim 1, wherein the metal layer comprises a metal selected from the group consisting of Co, Ti, W, Ta, Pt, Pd and Mo.

5. The method for fabricating semiconductor device according to claim 1, wherein the metal layer has a thickness of between 100 and 1000 Å.

6. The method for fabricating semiconductor device according to claim 1, wherein the first thermal treatment is performed at a temperature of between 500 and 800° C. for less than 30 minutes.

7. The method for fabricating semiconductor device according to claim 1, wherein the first thermal treatment is performed at a temperature of between 500 and 650° C. for less than 1 minute.

8. The method for fabricating semiconductor device according to claim 1, wherein the conductive oxide layer is removed by using a wet etch process.

9. The method for fabricating semiconductor device according to claim 8, wherein the wet etch process is performed by using HF solution or BOE solution.

10. The method for fabricating semiconductor device according to claim 1, wherein the second thermal treatment is performed at a temperature of between 500 and 800° C. for less than 10 minutes.

11. The method for fabricating semiconductor device according to claim 1, wherein the second thermal treatment is performed at a temperature of between 650 and 850° C. for less than 1 minute.

12. The method for fabricating semiconductor device according to claim 1, wherein the first and the second thermal treatments are performed in an atmosphere of $N_2$, Ar or $H_2$.

* * * * *